(12) United States Patent
Fu et al.

(10) Patent No.: US 11,403,982 B2
(45) Date of Patent: Aug. 2, 2022

(54) SHIFT REGISTER UNIT CIRCUIT AND DRIVING METHOD THEREOF, SCANNING DRIVE CIRCUIT AND DISPLAY PANEL

(71) Applicants: Ordos Yuansheng Optoelectronics Co., Ltd., Inner Mongolia (CN); BOE Technology Group Co., Ltd., Beijing (CN)

(72) Inventors: Yishan Fu, Beijing (CN); Jun Fan, Beijing (CN); Fuqiang Li, Beijing (CN); Han Zhang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 491 days.

(21) Appl. No.: 16/475,434

(22) PCT Filed: Nov. 23, 2018

(86) PCT No.: PCT/CN2018/117128
§ 371 (c)(1),
(2) Date: Jul. 2, 2019

(87) PCT Pub. No.: WO2019/141003
PCT Pub. Date: Jul. 25, 2019

(65) Prior Publication Data
US 2021/0343210 A1    Nov. 4, 2021

(30) Foreign Application Priority Data
Jan. 19, 2018    (CN) .......................... 201810054070.3

(51) Int. Cl.
G09G 3/36 (2006.01)
G09G 3/20 (2006.01)
G11C 19/28 (2006.01)

(52) U.S. Cl.
CPC ............... *G09G 3/20* (2013.01); *G11C 19/28* (2013.01); *G09G 2310/0286* (2013.01); *G09G 2310/08* (2013.01)

(58) Field of Classification Search
None
See application file for complete search history.

(56) References Cited

U.S. PATENT DOCUMENTS 9,791,968 B2    10/2017 Hu
2011/0044423 A1    2/2011 Lin
(Continued)

FOREIGN PATENT DOCUMENTS

CN    105096889 A    11/2015
CN    105185290 A    12/2015
(Continued)

OTHER PUBLICATIONS

International search report (including written opinion) of PCT application No. PCT/CN2018/117128 dated Feb. 27, 2019.
(Continued)

*Primary Examiner* — Carl Adams
(74) *Attorney, Agent, or Firm* — Fay Sharpe LLP

(57) ABSTRACT

A shift register unit circuit, a driving method thereof, a scanning drive circuit and a display panel are provided. The shift register unit circuit includes an input sub-circuit configured to set a level at a first node to be an effective level when an input terminal is at an effective level; at least two transmission sub-circuits configured to set a level at a coupled output control node to be an effective level when the first node is at the effective level; and at least two output (Continued)

sub-circuits, each of which is configured to conduct a coupled first clock signal terminal to a coupled output terminal when the coupled output control node is at an effective level.

19 Claims, 6 Drawing Sheets

(56) References Cited

U.S. PATENT DOCUMENTS

2017/0358267 A1* 12/2017 Feng .................... G09G 3/3677
2018/0211717 A1* 7/2018 Feng .................... G11C 19/287

FOREIGN PATENT DOCUMENTS

CN 107424649 A 12/2017
CN 108231122 A 6/2018

OTHER PUBLICATIONS

First office action of Chinese application No. 201810054070.3 dated Mar. 20, 2019.

\* cited by examiner

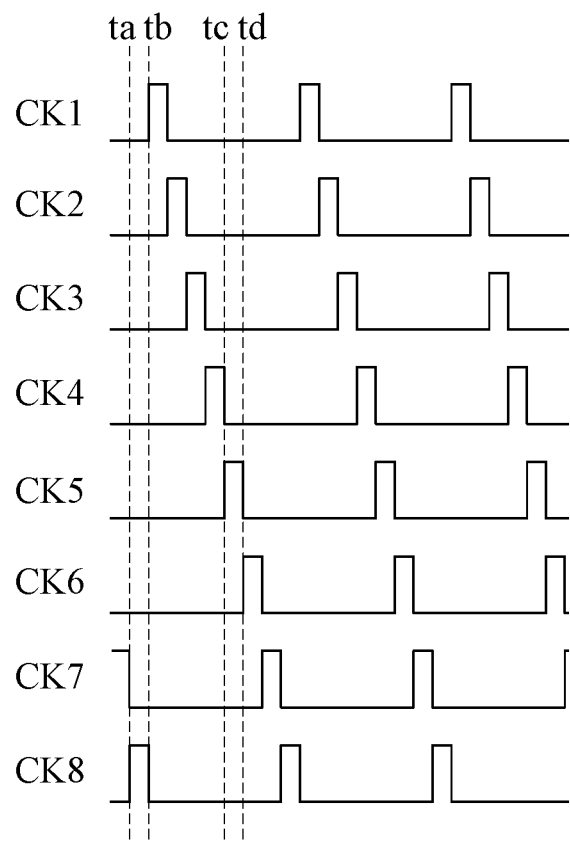
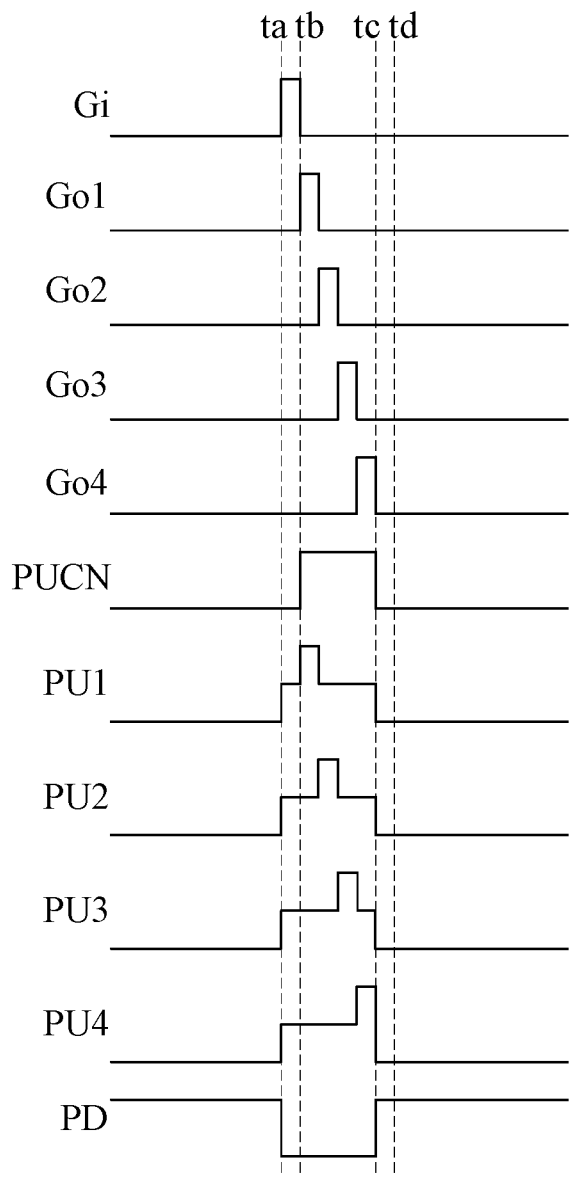
FIG. 5
FIG. 6

SHIFT REGISTER UNIT CIRCUIT AND DRIVING METHOD THEREOF, SCANNING DRIVE CIRCUIT AND DISPLAY PANEL

CROSS-REFERENCE TO RELATED APPLICATION

This application is a 371 of PCT Patent Application Serial No. PCT/CN2018/117128, filed on Nov. 23, 2018, which claims priority to Chinese Patent Application No. 201810054070.3, filed on Jan. 19, 2018 and entitled "SHIFT REGISTER UNIT CIRCUIT AND DRIVING METHOD THEREOF, SCANNING DRIVE CIRCUIT AND DISPLAY DEVICE", the entire contents of which are incorporated herein by reference.

TECHNICAL FIELD

The present disclosure relates to the display technology, and particularly to a shift register unit circuit, a driving method thereof, a scanning drive circuit and a display panel.

BACKGROUND

Compared with the conventional technology, with the GOA (Gate Driver On Array) technology, not only a circuit board for bearing a gate driver can be omitted, but also the design on two symmetric sides of a display panel can be realized. Furthermore, the chip binding region at the edge of the display panel and the wiring region, such as a fan-out region, can be omitted, which facilitates the implementation of a narrow frame design. With the rapid development of display technology, a higher demand on the esthetic degree of display products arises in the market. Thus, it becomes an important demand on many display products to further narrow the frames.

SUMMARY

The present disclosure provides a shift register unit circuit, a driving method thereof, a scanning drive circuit and a display panel.

In a first aspect, there is provided a scanning drive circuit, comprising at least one shift register unit circuit, wherein the shift register unit circuit comprises: an input sub-circuit coupled to a first node and an input terminal of the shift register unit circuit respectively and configured to set a level at the first node to be an effective level when the input terminal is at an effective level; at least two transmission sub-circuits, each of which is coupled to the first node and one output control node and configured to set a level at the coupled output control node to be an effective level when the first node is at an effective level; and at least two output sub-circuits, each of which is coupled to one output control node, one first clock signal terminal and one output terminal of the shift register unit circuit respectively and configured to conduct the coupled first clock signal terminal to the coupled output terminal when the coupled output control node is at an effective level.

In a possible implementation, the scanning drive circuit comprises a plurality of odd-number stages of the shift register unit circuits and a plurality of even-number stages of the shift register unit circuits; wherein every two adjacent odd-number stages of the shift register unit circuits are in a cascaded connection with each other, and every two adjacent even-number stages of the shift register unit circuits are in a cascaded connection with each other.

In another aspect, there is provided a display panel, comprising a scanning drive circuit, wherein the scanning drive circuit comprises a plurality of shift register unit circuits and each of the shift register unit circuits comprises: an input sub-circuit coupled to a first node and an input terminal of the shift register unit circuit and configured to set a level at the first node to be an effective level when the input terminal is at an effective level; at least two transmission sub-circuits, each of which is coupled to the first node and one output control node and configured to set a level at the coupled output control node to be an effective level when the first node is at an effective level; and at least two output sub-circuits, each of which is coupled to one output control node, one first clock signal terminal and one output terminal of the shift register unit circuit respectively and configured to conduct the coupled first clock signal terminal to the coupled output terminal when the coupled output control node is at an effective level; wherein in the plurality of shift register unit circuits, odd-number stages of the shift register unit circuits and even-number stages of the shift register unit circuits are at two side of the display panel, respectively In yet another aspect, there is provided a shift register unit circuit, comprising: an input sub-circuit coupled to a first node and an input terminal of the shift register unit circuit and configured to set a level at the first node to be an effective level when the input terminal is at an effective level; at least two transmission sub-circuits, each of which is coupled to the first node and one output control node and configured to set a level at the coupled output control node to be an effective level when the first node is at an effective level; and at least two output sub-circuits, each of which is coupled to one output control node, one first clock signal terminal and one output terminal of the shift register unit circuit and configured to conduct the coupled first clock signal terminal to the coupled output terminal when the coupled output control node is at an effective level.

In a possible implementation, the at least two transmission sub-circuits comprise four of the transmission sub-circuits, and the at least two output sub-circuits comprise four of the output sub-circuits.

In a possible implementation, the shift register unit circuit further comprises: a reset control sub-circuit, coupled to the first node and a second node respectively, and configured to set a level at the second node to be an ineffective level when the first node is at an effective level and set a level at the second node to be an effective level when the first node is at an ineffective level; at least two first reset sub-circuits, each of which is coupled to the second node, and one of the output terminals, and each first reset sub-circuit is configured to set a level at the coupled output terminal to be an ineffective level when the second node is at an effective level; and a second reset sub-circuit coupled to the second node and configured to set the level at each output control node to be an ineffective level when the second node is at an effective level.

In a possible implementation, the reset control sub-circuit comprises: a reset control portion coupled to the first node and the second node respectively and configured to set the level at the second node to be an ineffective level when the first node is at an effective level; and an enable control portion coupled to the second node and a second clock signal terminal respectively and configured to set the level at the second node to be an effective level when the coupled second clock signal terminal is at an effective level and the first node is at an ineffective level; wherein each clock cycle of the first clock signal provided by the first clock signal terminal and the second clock signal provided by the second clock signal terminal comprises a first time period and a second time period that are separated from each other, the second time period refers to a time period in which the second clock signal terminal is at an effective level, and a time period in which the first clock signal terminal coupled to any of the output sub-circuits is at an effective level is within the first time period.

In a possible implementation, the second clock signal terminal comprises a forward scanning clock signal terminal and a reverse scanning clock signal terminal, a start moment of the first time period in each clock cycle coincides with a moment when the reverse scanning clock signal terminal switches from an effective level to an ineffective level, and an end moment of the first time period in each clock cycle coincides with a moment when the forward scanning clock signal terminal switches from an ineffective level to an effective level; and the enable control portion comprises a first transistor, a second transistor and a third transistor, wherein a gate of the first transistor is coupled to a forward scanning control signal terminal, one of a source and a drain of the first transistor is coupled to the forward scanning clock signal terminal, and the other one of the first transistor is coupled to a third node; a gate of the second transistor is coupled to a reverse scanning control signal terminal, one of a source and a drain of the second transistor is coupled to the reverse scanning clock signal terminal, and the other one of the second transistor is coupled to the third node; and a gate of the third transistor is coupled to the third node, one of a source and a drain of the third transistor is coupled to a first power source terminal, and the other one of the third transistor is coupled to the first node.

In a possible implementation, the enable control portion further comprises a first capacitor, wherein one terminal of the first capacitor is coupled to the second node and the other terminal of the first capacitor is coupled to a second power source terminal.

In a possible implementation, the reset control portion comprises a fourth transistor, wherein a gate of the fourth transistor is coupled to the first node, one of a source and a drain of the fourth transistor is coupled to the second node, and the other one of the fourth transistor is coupled to the second power source terminal.

In a possible implementation, the second reset sub-circuit comprises a fifth transistor, wherein a gate of the fifth transistor is coupled to the second node, one of a source and a drain of the fifth transistor is coupled to the first node, and the other one of the fifth transistor is coupled to a third power source terminal.

In a possible implementation, the first reset sub-circuit comprises a sixth transistor, wherein a gate of the sixth transistor is coupled to the second node, one of a source and a drain of the sixth transistor is coupled to the corresponding output terminal, and the other one of the sixth transistor is coupled to terminal fourth power source terminal.

In a possible implementation, the transmission sub-circuit comprises a seventh transistor, and the output sub-circuit comprises an eighth transistor, wherein a gate of the seventh transistor is coupled to a fifth power source terminal, a source of the seventh transistor is coupled to the first node, and a drain of the seventh transistor is coupled to the corresponding output control node; and a gate of the eighth transistor is coupled to the corresponding output control node, one of a source and a drain of the eighth transistor is coupled to the corresponding first clock signal terminal and the other one of the eighth transistor is coupled to the corresponding output terminal.

In a possible implementation, the input sub-circuit comprises a ninth transistor; wherein a gate of the ninth transistor is coupled to the input terminal, one of a source and a drain of the ninth transistor is coupled to a scanning control signal terminal, and the other one of the ninth transistor is coupled to the first node.

In a possible implementation, the input sub-circuit is further coupled to a reset terminal of the shift register unit circuit and further configured to set the level at the first node to be an ineffective level when the reset terminal is at an effective level; the input terminal and the reset terminal are one of a forward input terminal and a reverse input terminal of the shift register unit circuit respectively.

In a possible implementation, the input sub-circuit comprises a ninth transistor and a tenth transistor, wherein a gate of the ninth transistor is coupled to the forward input terminal, one of a source and a drain of the ninth transistor is coupled to a forward scanning control signal terminal, and the other one of the ninth transistor is coupled to the first node; and a gate of the tenth transistor is coupled to the reverse input terminal, one of a source and a drain of the tenth transistor is coupled to a reverse scanning control signal terminal and the other one of the tenth transistor is coupled to the first node.

In a possible implementation, the shift register unit circuit further comprises: an eleventh transistor, wherein a gate of the eleventh transistor is coupled to a control signal terminal, one of a source and a drain of the eleventh transistor is coupled to the second node and the other one of the eleventh transistor is coupled to a second power source terminal.

In a possible implementation, the shift register unit circuit further comprises: a second capacitor, wherein one terminal of the second capacitor is coupled to the first node and the other terminal of the second capacitor is coupled to a third power source terminal.

In yet another aspect, there is provided a method for driving any one of the shift register unit circuits described above. The driving method comprises: setting a level at the input terminal to be at an effective level before a first time period; wherein the first time period is a time period in each clock cycle of the first clock signal terminal, a time period in which a first clock signal terminal coupled to any of the output sub-circuits is at an effective level is within the first time period, and the gate-on voltage is provided by the first clock signal terminal at the effective level.

BRIEF DESCRIPTION OF THE DRAWINGS

FIG. 5 is a circuit timing sequence diagram of a shift register unit circuit provided in embodiments of the present disclosure;

FIG. 6 is a circuit timing sequence diagram of another shift register unit circuit provided in embodiments of the present disclosure.

DETAILED DESCRIPTION

To make the objects, technical solutions and advantages of the present disclosure more clearly, the embodiments of the present disclosure will be described below in detail in conjunction with the accompanying drawings. It is obvious that the described embodiments are part rather than all of the embodiments of the present disclosure. All other embodiments obtained by those of ordinary skill in the art based on the embodiments of the present disclosure without creative work are within the scope of protection of the present disclosure. Unless otherwise defined, technical terms or scientific terms used in the present disclosure shall be of ordinary meaning as understood by those of ordinary skill in the art to which the present disclosure pertains. The term "first" or "second" or a similar term used in the present disclosure does not denote any order, quantity, or importance, but is merely used to distinguish different components. The term "comprising" or a similar term means that elements or items which appear before the term include the elements or items listed after the term and their equivalents, and do not exclude other elements or items. The term "coupling" or "coupled to" or a similar term is not limited to a physical or mechanical coupling but may include an electrical coupling that is direct or indirect.

A shift register unit circuit is a basic component of a gate driver (also referred to as a scanning drive circuit), and its main function is to provide a gate scanning signal for the coupled gate line. In order to meet the demand for narrowing the frame, the structure of the internal circuit of the shift register unit circuit needs to be as simple as possible, so as to compress the space required for arranging the gate driver. However, with the continuous simplification of the structure of the internal circuit of the shift register unit circuit, it is difficult to further reduce the amount of the thin film transistors (TFTs) in each shift register unit circuit on the premise of satisfying the application requirements, which makes it difficult to further compress the space required by the gate driver. Thus, further narrowing of the frame is hindered.

Figure 1:
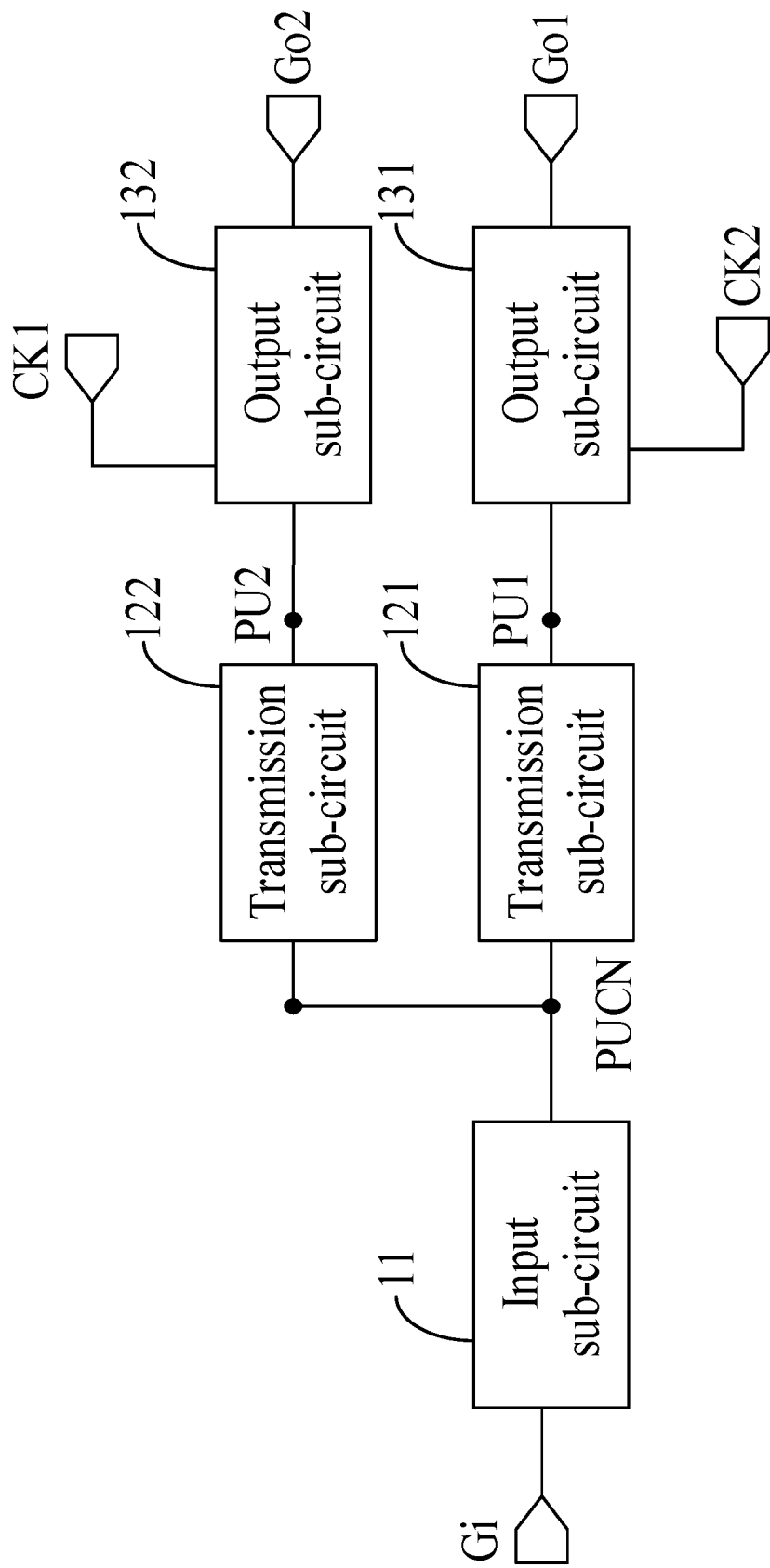
FIG. 1 is a structural block diagram of a shift register unit circuit provided in embodiments of the present disclosure.

FIG. 1 is a structural block diagram of a shift register unit circuit provided in embodiments of the present disclosure. Referring to FIG. 1, the shift register unit circuit includes an input terminal Gi, and at least two output terminals (e.g., an output terminal Go1 and an output terminal Go2 in FIG. 1), and further includes an input sub-circuit 11, at least two transmission sub-circuits (e.g., a transmission sub-circuit 121 and a transmission sub-circuit 122 in FIG. 1), and at least two output sub-circuits (e.g., an output sub-circuit 131 and an output sub-circuit 132 in FIG. 1).

The input sub-circuit 11 is coupled to the input terminal Gi and a first node PUCN respectively and configured to set a level at the first node PUCN to be an effective level when the input terminal Gi is at an effective level.

Each transmission sub-circuit is coupled to the first node PUCN and an output control node (e.g., an output control node PU1 and an output control node PU2 in FIG. 1) and configured to set a level at the coupled output control node to be an effective level when the first node PUCN is at an effective level.

Each output sub-circuit is coupled to an output control node, a first lock signal terminal (for example, the first clock signal terminals CK1 and CK2 shown in FIG. 1) and an output terminal and configured to conduct the coupled first clock signal terminal to the coupled output terminal when the coupled output control node is at an effective level.

In an example, by controlling the level at the control input terminal Gi, it may enable that: the first clock signal terminal coupled to each output sub-circuit sequentially outputs gate-on voltage for a predetermined time duration during the period in which the level at first node PUCN is at an effective level. Thus, one shift register unit circuit is enabled to have the capability of providing gate scanning signals for at least two gate lines respectively.

In summary, with the shift register unit circuit provided in the embodiments of the present disclosure, output of at least two stages of signals can be implemented through input of one stage of signals. Compared with the case where input of one stage of signals implements output of one stage of signals, the amount of transistors required by the gate driver is reduced, which contributes to compression of the space occupied by the gate driver and makes the frame of the display product narrower.

In an example, the at least two output sub-circuits are in a one-to-one correspondence with at least two transmission sub-circuits, and are also in a one-to-one correspondence with at least two output terminals. Each output sub-circuit is coupled to a corresponding output terminal, and each output sub-circuit and the corresponding one transmission sub-circuit are coupled to the same output control node.

Exemplarily, as shown in FIG. 1, the output sub-circuit 131 corresponds to the transmission sub-circuit 121 and the output terminal Go1, and the output sub-circuit 132 corresponds to the transmission sub-circuit 122 and the output terminal Go2. The output sub-circuit 131 is coupled to the corresponding output terminal Go1, and the output sub-circuit 131 and the corresponding transmission sub-circuit 121 are both coupled to the output control node PU1. The output sub-circuit 132 is coupled to corresponding output terminal Go2, and the output sub-circuit 132 and the corresponding transmission sub-circuit 122 are both coupled to the output control node PU2.

Figure 2:
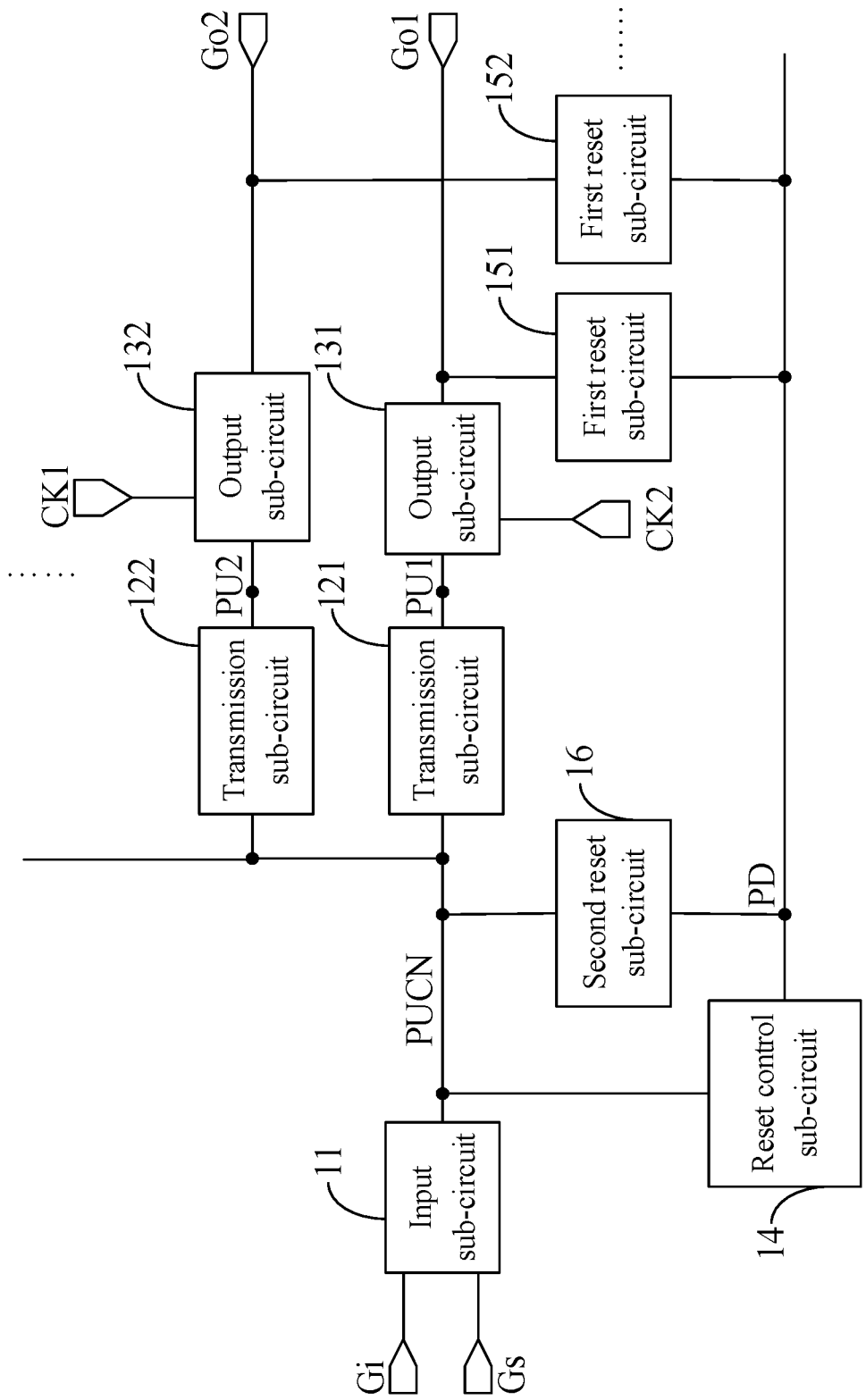
FIG. 2 is a structural diagram of a circuit in a shift register unit circuit provided in embodiments of the present disclosure.

FIG. 2 is a structural block diagram of another shift register unit circuit provided in embodiments of the present disclosure. As shown in FIG. 2, the shift register unit circuit may further include: a reset control sub-circuit 14, at least two first reset sub-circuit (for example, the first reset sub-circuit 151 and the first reset sub-circuit 152 shown in FIG. 2), and a second reset sub-circuit 16.

The reset control sub-circuit 14 is coupled to the first node PUCN and the second PD respectively and configured to set a level at the second node PD to be an ineffective level when the first node PUCN is at an effective level and to set the level at the second node PD to be at an effective level when the first node PUCN is at an ineffective level.

Each first reset sub-circuit is coupled to the second node PD and an output terminal and configured to set a level at the coupled output terminal to be at an ineffective level when the second node PD is at an effective level.

The second reset sub-circuit 16 is coupled to the second node PD and configured to set a level at each output control node to be at an ineffective level when the second node PD is at an effective level.

It should be noted that the effective level and the ineffective level in the text refer to two different pre-configured voltage ranges (both based on a common-terminal voltage) in terms of a specific circuit node or signal. In an example, the effective levels of all circuit nodes are high levels. In another example, the effective levels of all circuit nodes are low levels. In yet another example, the effective level at the input terminal Gi is a low level, and the effective levels at the first node PUCN and the second node PD are high levels. Certainly, the setting modes of the effective level or the ineffective level may not be only limited to the above examples.

In an example, referring to FIG. 2, the input sub-circuit 11 may further be coupled to the reset terminal Gs, and may further be configured to set the level at the first node PUCN to be an ineffective level when the reset terminal Gs is at an effective level. Here, the input terminal Gi and the reset terminal Gs may be one of the forward input terminal GF and the reverse input terminal GB of the shift register unit circuit, respectively.

The level at the reset terminal Gs can be controlled to enable that the level at the first node PUCN is an ineffective level when a gate-on voltage is at any output terminal. Thus, the reset control sub-circuit 14 can, under control of the first node PUCN, set the level at the second node PD to be at an effective level. Further, the first reset sub-circuit can set levels at all the output terminals as ineffective levels. The second reset sub-circuit 16 can set levels at all the output control nodes as ineffective levels. In this way, reset of the shift register unit circuit can be realized, and the reset shift register unit circuit can stably keep in the state that the level at the output terminal is an ineffective level without output of the gate-on voltage.

It should be understood that the reset of the shift register unit circuit is achieved based on the reset terminal Gs, the reset control sub-circuit 14, the first reset sub-circuit and the second reset sub-circuit 16. Based on different application requirements, other modes may be adopted to reset the shift register unit circuit with reference to the circuit design in the related art. For example, reset may be realized by conducting the first node PUCN, all output terminals and all output control nodes to the power source terminals coupled thereto and configured to provide an ineffective-level respectively when the reset terminal Gs is at an effective level, which is not limited thereto.

Figure 3:
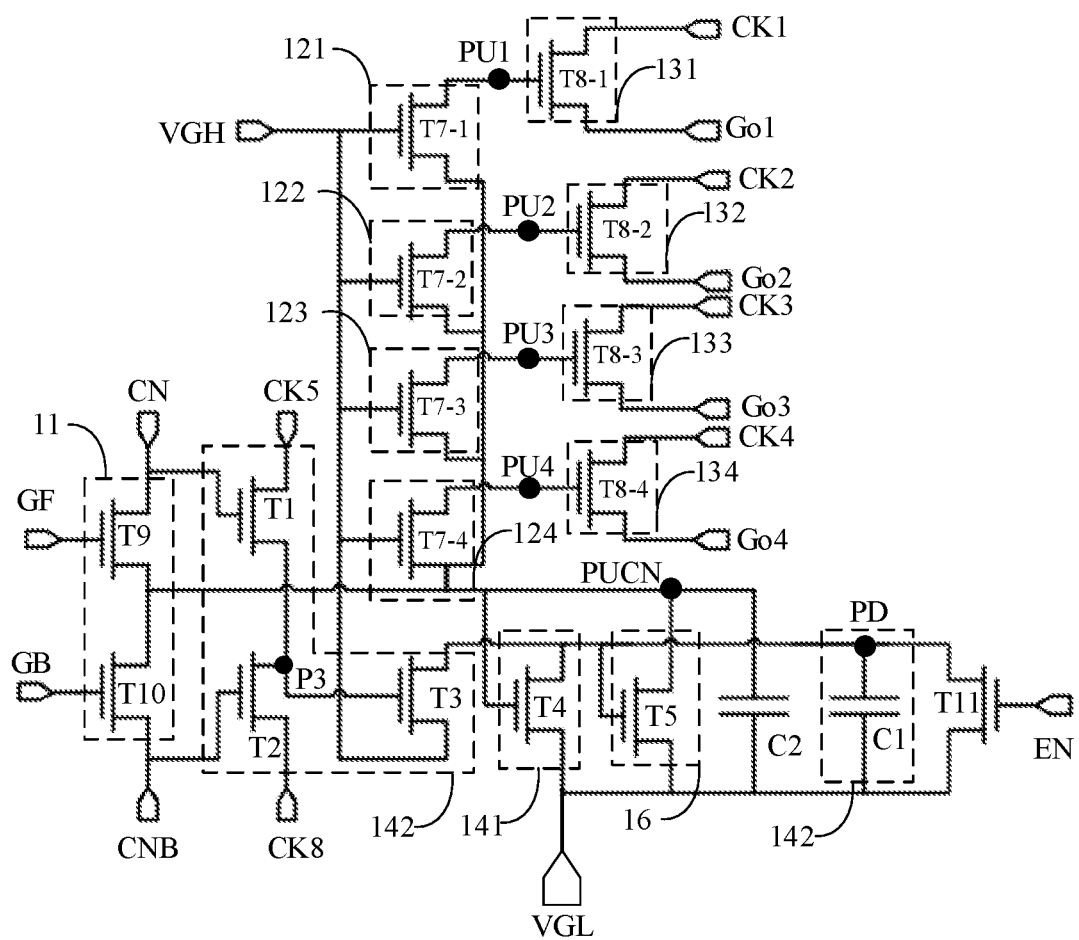
FIG. 3 is a structural diagram of a circuit in another shift register unit circuit provided in embodiments of the present disclosure.
Figure 4:
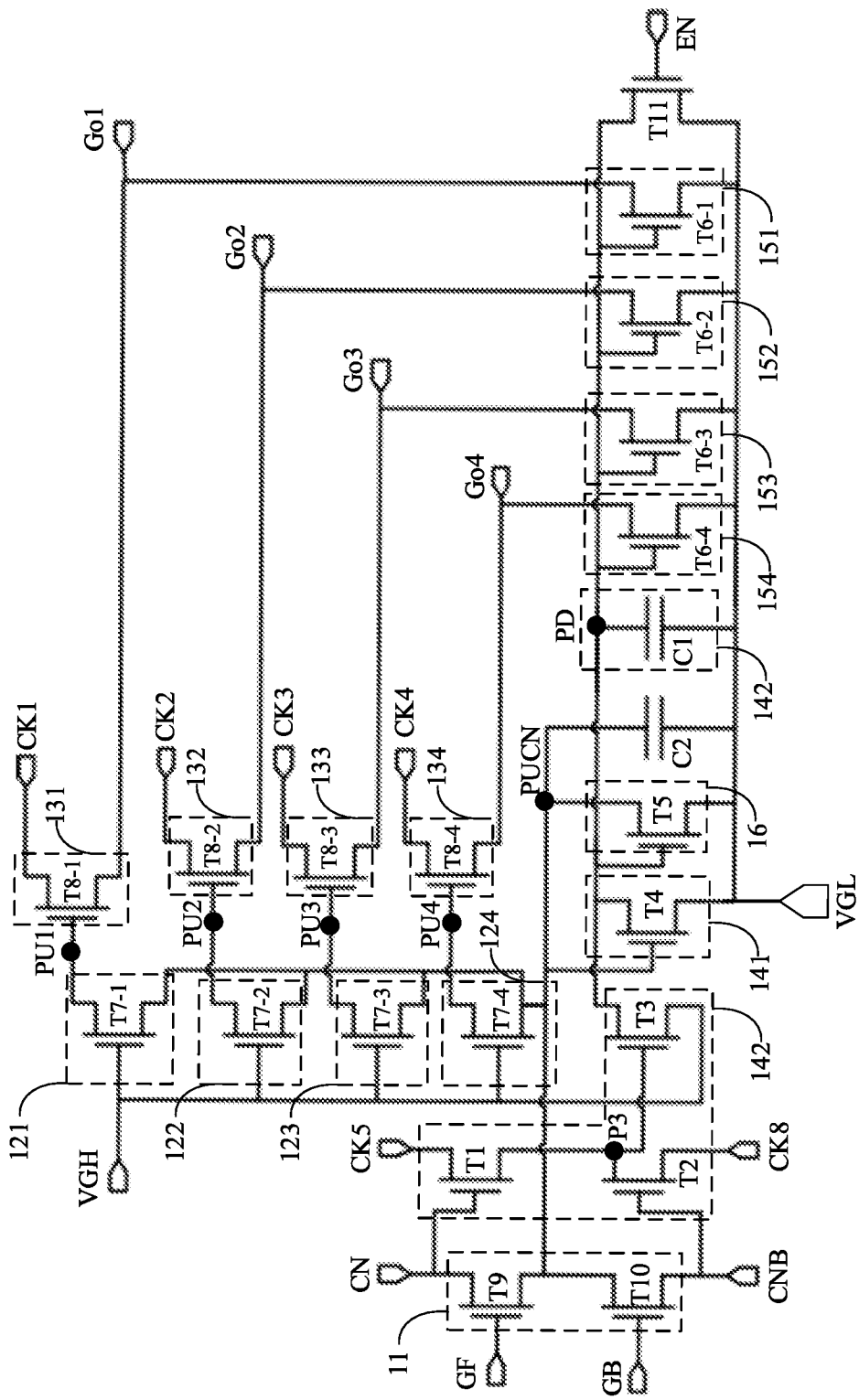
FIG. 4 is a structural diagram of a circuit in yet another shift register unit circuit provided in embodiments of the present disclosure.

FIG. 3 is a structural diagram of a circuit in another shift register unit circuit provided in embodiments of the present disclosure. FIG. 4 is a structural diagram of a circuit in yet another shift register unit circuit provided in embodiments of the present disclosure. Referring to FIG. 3 and FIG. 4, the reset control sub-circuit 14 may include a reset control portion 141 and an enable control portion 142.

The reset control portion 141 is coupled to the first node PUCN and the second node PD respectively. The reset control portion 141 is configured to set the level at the second node PD as an ineffective level when the first node PUCN is at an effective level.

The enable control portion 142 is coupled to the second node PD and the second clock signal terminal respectively. The enable control portion 142 is configured to set the level at the second node PD as an effective level when the second clock signal terminal (for example, the forward scanning clock signal terminal CK5 and the reverse scanning clock signal terminal CK8) is at an effective level and the first node PUCN is at an ineffective level.

Exemplarily, the shift register unit circuit shown in FIG. 4 may include a forward input terminal GF, a reverse input terminal GB, four output terminals Go1, Go2, Go3 and Go4, and may further include an input sub-circuit 11, four transmission sub-circuits 121, 122, 123 and 124, four output sub-circuits 131, 132, 133 and 134, four first reset sub-circuits 151, 152, 153 and 154, and a second reset sub-circuit 16. In the present embodiment, the shift register unit circuit is coupled to four first clock signal terminals CK1, CK2, CK3 and CK4. Here, the output sub-circuit 131 is coupled to the first clock signal terminal CK1. The output sub-circuit 132 is coupled to the first clock signal terminal CK2. The output sub-circuit 133 is coupled to the first clock signal terminal CK3. The output sub-circuit 134 is coupled to the first clock signal terminal CK4.

Referring to FIG. 3 and FIG. 4, the enable control portion 142 includes a first transistor T1, a second transistor T2 and a third transistor T3. Here, the gate of the first transistor T1 is coupled to a forward scanning control signal terminal CN, one of a source and a drain of the first transistor T1 is coupled to a forward scanning clock signal terminal CK5 and the other one is coupled to a third node P3. The gate of the second transistor T2 is coupled to a reverse scanning control signal terminal CNB, one of a source and a drain of the second transistor 2 is coupled to a reverse scanning clock signal terminal CK8 and the other one is coupled to the third node P3. The gate of the third transistor T3 is coupled to the third node P3, one of a source and a drain of the third transistor T3 is coupled to a first power source terminal VGH, and the other one is coupled to the first node PUCN. Here, the first power source terminal VGH may provide an effective level for the first node PUCN.

It should be noted that based on different types of transistors, different connections between the sources and the drains of the transistors can be set to match with the directions of current that flows through the transistors. When the source and the drain of the transistor are symmetrical, the source and the drain can be regarded as two electrodes that are not particularly distinguished from each other. The embodiment takes that all the transistors are N-type transistors, and effective levels of all the circuit nodes and signals are high levels as an example. It shall be appreciated that the technical solution of the present disclosure is not limited to this implementation.

In an example, the moment (the moment at which a gate-on voltage is no longer at any output terminal in a display cycle) at which gate-on voltages at at least two output terminals stop being output under the circumstance of forward scanning coincides with the moment at which the forward scanning clock signal terminal CK5 switches from an ineffective level to an effective level. While, the moment at which gate-on voltages at at least two output terminals stop being output under the circumstance of reverse scanning coincides with the moment at which the reverse scanning clock signal terminal CK8 switches from an ineffective level to an effective level.

Thus, the forward scanning clock signal terminal CK5 is always conducted to the third node P3 when the forward scanning control signal terminal CN is at a high level (it indicates that forward scanning is performed at present), such that the level at the second node PD is set by the third transistor T3 as a high level serving as an effective level, at the moment when the gate-on voltages at the at least two output terminals stop being output, and thereby reset of the shift register unit circuit is triggered. The reverse scanning clock signal terminal CK8 is always conducted to the third node P3 when the reverse scanning control signal terminal CNB is at a high level (it indicates that reverse scanning is performed at present), such that the level at the second node PD is set by the third transistor T3 as a high level serving as an effective level, at the moment when the gate-on voltages at the at least two output terminals stop being output, and thereby reset of the shift register unit circuit is triggered.

Referring to FIG. 3 and FIG. 4, the reset control portion 141 may include a fourth transistor T4. The gate of the fourth transistor T4 is coupled to the first node PUCN, one of a source and a drain of the fourth transistor T4 is coupled to the second node PD, and the other one is coupled to a second power source terminal configured to provide an ineffective level for the second node PD. For example, the second power source terminal may be a low-level voltage terminal VGL.

The second reset sub-circuit 16 may include a fifth transistor T5. The gate of the fifth transistor T5 is coupled to the second node PD, one of a source and a drain of the fifth transistor T5 is coupled to the first node PUCN and the other one is coupled to a third power source terminal configured to provide an ineffective level for the first node PUCN. Exemplarily, as shown in FIG. 4, the third power source terminal may also be a low-level voltage terminal VGL.

Thus, when the first node PUCN is at a high level, the fourth transistor T4 can forcibly set the level at the second node PD as a low level (for example, it may be realized by setting the width-to-length ratio of a channel of the fourth transistor T4 to be greater than that of a channel of the fifth transistor T5). When the second node PD is at a high level, the fifth transistor T5 can set the level at the first node PUCN as a low level to realize part of the reset function.

Taking this as an example, the reset control portion 141 with the above structure can achieve the function of setting the level at the second node PD to be at an ineffective level when the first node PUCN is at an effective level. The enable control portion 142 respectively coupled to the second node PD and the second clock signal terminal (each of the forward scanning clock signal terminal CK5 and the reverse scanning clock signal terminal CK8 is a second clock signal terminal) can achieve the function of setting the level at the second node PD to be at an effective level when the coupled second clock signal terminal is at an effective level and the first node PUCN is at an ineffective level. Certainly, the possible implementation of achieving the function is not limited to the above example.

For the first clock signal provided by the first clock signal terminal and the second clock signal provided by the second clock signal terminal, the time period in which each first clock signal is at an effective level in a certain clock cycle is within the time period in which the gate-on voltage is output, and the time period in which each second clock signal is at an effective level in the same clock cycle is beyond the time period in which the gate-on voltage is output. Thus, if the time period in which the second clock signal is at an effective level in each clock cycle is referred to as a second time period, and the time period in each clock cycle, including the time period in which all the first clock signals are at the effective levels, is called a first time period, the first time period and the second time period in each time cycle can be set to be separated from each other.

In an example, it can be set that the end moment of the first time period in each clock cycle coincides with the moment at which the second clock signal from the forward scanning clock signal terminal CK5 switches from an ineffective level to an effective level. It can also be set that the start moment of the first time period in each clock cycle coincides with the moment at which the second clock signal from the reverse scanning clock signal terminal CK8 switches from an effective level to an ineffective level. Thus, under the circumstances of forward scanning and reverse scanning, reset can be immediately performed after the gate-on voltages at the at least two output terminals stop being output, which helps improve the stability of the gate scanning signal.

Referring to FIG. 3 and FIG. 4, the enable control portion 142 in the reset control sub-circuit 14 may further include a first capacitor C1. One terminal of the first capacitor C1 is coupled to the second node PD, and the other terminal thereof is coupled to the second power source terminal VGL configured to provide an ineffective level for the second node PD, which helps stabilize the potential at the second node PD and reduce the probability of false output.

Taking the reset control sub-circuit 14 in FIG. 3 and FIG. 4 as an example, other means can also be adopted to set the level at the second node PD to be at an ineffective level when the first node PUCN is at an effective level, and to set the level at the second node PD to be at an effective level when the level at the first node PUCN switches to an ineffective level, for example, by means of omitting the first capacitor C1, but is not limited thereto.

As shown in FIG. 4, each of the four first reset sub-circuits 151, 152, 153 and 154 includes a sixth transistor T6. For example, the first reset sub-circuit 151 includes a sixth transistor T6-1, the first reset sub-circuit 152 includes a sixth transistor T6-2, the first reset sub-circuit 153 includes a sixth transistor T6-3 and the first reset sub-circuit 154 includes a sixth transistor T6-4. The gate of the sixth transistor T6 is coupled to the second node PD, one of the source and the drain of the sixth transistor T6 is coupled to the corresponding output terminal, for example, the corresponding output terminal Go1, Go2, Go3 and Go4 respectively, and the other one of the source and the drain is coupled to a fourth power source terminal configured to provide an ineffective level voltage for the corresponding output terminal. For example, the fourth power source terminal may also be a low-level voltage terminal VGL. Thus, the sixth transistor T6 can set the level at the corresponding output terminal as a low level when the second node PD is at an effective level, to achieve part of the reset function.

With continuous reference to FIG. 3 and FIG. 4, each of the four transmission sub-circuits 121, 122, 123 and 124 includes a seventh transistor T7. For example, the transmission sub-circuit 121 includes a seventh transistor T7-1, the transmission sub-circuit 122 includes a seventh transistor T7-2, the transmission sub-circuit 123 includes a seventh transistor T7-3, and the transmission sub-circuit 124 includes a seventh transistor T7-4. The gate of the seventh transistor T7 is coupled to a fifth power source terminal configured to provide a gate-on voltage for the seventh transistor T7. For example, the fifth power source terminal may be an effective-level voltage terminal VGH, and the gate-on voltage may be a high-level voltage. The source of the seventh transistor T7 is coupled to the first node PUCN and the drain of the seventh transistor T7 is coupled to the corresponding output control node, for example, the output control node PU1, PU2, PU3 and PU4 respectively. Thus, each of the seventh transistors T7 can set the level at the corresponding output control node to be at an effective level when the first node PUCN is at an effective level, to achieve the function of the transmission sub-circuits.

It should be appreciated that when the gate and the source of the seventh transistor T7 are at high-level voltage and the corresponding output control node is at a voltage higher than the high-level voltage, weak current between the source and the drain cannot set the first node PUCN to be at a voltage higher than the above high-level voltage since the seventh transistor T7 still works in a cut-off region.

As shown in FIG. 3 and FIG. 4, each of the four output sub-circuits 131, 132, 133 and 134 includes an eighth transistor T8. For example, the output sub-circuit 131 includes an eighth transistor T8-1, the output sub-circuit 132 includes an eighth transistor T8-2, the output sub-circuit 133 includes an eighth transistor T8-3 and the output sub-circuit 134 includes an eighth transistor T8-4. The gate of the eighth transistor T8 is coupled to the corresponding output control node, for example, the output control node PU1, PU2, PU3 and PU4 respectively. One of the source and the drain of the eighth transistor T8 is coupled to the corresponding first clock signal terminal, for example, the first clock signal terminal CK1, CK2, CK3 and CK4 respectively, and the other one of the source and the drain is coupled to the corresponding output terminal, for example, the output terminal Go1, Go2, Go3 and Go4 respectively. Thus, when the corresponding output control node is at a high level, the eighth transistor T8 can conduct the corresponding first clock signal terminal to the corresponding output terminal, to achieve the function of the output sub-circuits.

In an example, a capacitor (for example, formed by overlapping a gate with a drain) is disposed between the electrode (taking the drain as an example below), coupled to the first clock signal terminal, of the eighth transistor T8 and the gate of the eighth transistor T8, and capacitor can maintain the potential difference between the drain and the gate of the eighth transistor T8, such that the capacitor is charged when the first clock signal terminal is at a low level and the output control node is at a high level. Thereafter, the high-level voltage at the output control node switches to a voltage higher than the high-level voltage under the action of the charge retention function of the capacitor when the first clock signal terminal switches from the low level to the high level. Thus, current between the source and the drain of the eighth transistor T8 increases, and the potential at the output terminal is set as the high level more quickly. That is, the self-boosting function is realized.

Referring to FIG. 3 and FIG. 4, the input sub-circuit 11 may include a ninth transistor T9 and a tenth transistor T10. Here, the gate of the ninth transistor T9 is coupled to a forward input terminal GF, one of the source and the drain is coupled to the forward scanning control signal terminal CN and the other thereof is coupled to the first node PUCN. The gate of the tenth transistor T10 is coupled to the reverse input terminal GB, one of the source and the drain is coupled to the reverse scanning control signal terminal CNB and the other thereof is coupled to the first node PUCN.

Thus, under the circumstance of forward scanning, the forward scanning control signal terminal CN is at a high level, the ninth transistor T9 can set the level at the first node PUCN as a high level when the forward input terminal GF is at a high level, and the tenth transistor T10 can set the level at the first node PUCN as a low level when the reverse output terminal GB is at a high level. That is, in this case, the forward input terminal GF is the input terminal Gi of the shift register unit circuit, and the reverse output terminal GB is the reset terminal Gs of the shift register unit circuit.

Under the circumstance of reverse scanning, the reverse scanning control signal terminal CNB is at a high level, the tenth transistor T10 can set the level at the first node PUCN as a high level when the forward input terminal GF is at a high level, and the ninth transistor T9 can set the level at the first node PUCN as a low level when the reverse output terminal GB is at a high level. That is, in this case, the reverse output terminal GB is the input terminal Gi of the shift register unit circuit, and the forward input terminal GF is the reset terminal Gs of the shift register unit circuit.

It can be seen that the function of the input sub-circuit 11 can be achieved by the above means, and switch between forward scanning and reverse scanning of the shift register unit circuit can be achieved based on this. That is, the shift register unit circuit is enabled to have a bidirectional scanning function.

As shown in FIG. 3 and FIG. 4, the shift register unit circuit provided in the embodiments of the present disclosure may further include an eleventh transistor T11. The gate of the eleventh transistor T11 is coupled to a control signal terminal EN, one of the source and the drain of the eleventh transistor T11 is coupled to the second node PD, and the other thereof is coupled to as the second power source terminal VGL configured to provide an ineffective level for the second node PD. Thus, the control signal line terminal EN can be enabled to switch to be at a high level at any time to make the reset function of the shift register unit circuit ineffective. That is, the reset of the shift register unit circuit may be externally controlled by the control signal line terminal EN.

With continuous reference to FIG. 3 and FIG. 4, the shift register unit circuit provided in the embodiments of the present disclosure may further include a second capacitor C2. One terminal of the second capacitor C2 is coupled to the first node PUCN and the other terminal of the second capacitor C2 is coupled to a third power source terminal VGL configured to provide an ineffective level for the first node PUCN, which can help stabilize the potential at the first node PUCN, lower the probability of false output, and enhance the reliability of the shift register unit circuit.

It should be noted that the transistors shown in FIG. 3 and FIG. 4 are all N-type transistors. That is, the transistors can be formed by the same manufacturing process to reduce the manufacturing cost. For the convenience of understanding, the embodiment is illustrated by taking an example in which all the transistors are N-type transistors, the high level is taken as an effective level and the low level is taken as an ineffective level. Certainly, during implementation, the low level maybe taken as an effective level, the high level may be taken as an ineffective level, and/or part or all of the N-type transistors are replaced with P-type transistors.

For example, the following changes can be made based on the embodiments of the present disclosure: all the transistors in FIG. 3 and FIG. 4 are disposed as P-type transistors, and the high level and the low level of relevant signals are interchanged. For example, the low-level voltage terminal VGL is changed from outputting the low level to outputting the high level, and the high-level voltage terminal VGH is changed from outputting the high level to outputting the low level. It is easily understood that these changes will change the high level to the low level, the low level to the high level, potential pull-up to potential pull-down, potential pull-down to potential pull-up in the working principle of the circuit, and while the essence of the working principle of the circuit remains unchanged. Thus, the structure, timing sequence and working principle of the modified circuit may be understood in accordance with the above embodiment, which will not be repeated herein.

Based on the same inventive concept, embodiments of the present disclosure provide a driving method of a shift register unit circuit. The shift register unit circuit may be any of the above shift register unit circuits. The driving method includes: setting a level at the input terminal to be at an effective level before a first time period d. Here, the first time period is a time period within each clock cycle of the first clock signal. The time period in which the first clock signal coupled to any of the output sub-circuits is at an effective level is within the first time period. Therefore, the first time period is a time period during which gate-on voltage is predetermined to be output at at least two output terminals of the shift register unit circuit. The gate-on voltage is provided by the first clock signal that is at an effective level.

It should be understood that the first time period continuously repeats along with the clock cycle, and whether each output terminal of the shift register unit circuit outputs a signal or not (i.e., provide effective output for the outside, for example, output gate-on voltage) in the first time period mainly depends on whether each output control node is at an effective level or not at the beginning of the first time period. Thus, before the first time period during which signals are needed to be output, the level at the input terminal Gi of the shift register unit circuit may be set to be at an effective level by any means, and thereby each output terminal output signals as expected in the coming first time period.

It should be further appreciated that the working process of any shift register unit circuit may be regarded as an example of implementation of the above driving method. Thus, examples of the specific process of each step described above may be made reference to the parts related to the working process of the shift register unit circuit.

It can be seen that the driving method of the shift register unit circuit in the embodiments of the present disclosure may be applied to any of the above-described shift register unit circuits, to implement output of at least two stages of signals by input of one stage of signals. Compared with the case in which input of one stage of signals is utilized to realize output of one stage of signals, the amount of transistors required by the gate driver can be reduced, which contributes to compression of the space occupied by the gate driver, and make the frame of the display product narrower.

FIG. 5 and FIG. 6 show the circuit timing sequence diagrams of the shift register unit circuit shown in FIG. 4. In the present embodiment, the clock signals provided by eight clock signal terminals, i.e., CK1 to CK8, shown in FIG. 5 are used as a synchronous clock used by the gate driver. However, for the shift register unit circuit shown in FIG. 4, the clock signal terminals CK1, CK2, CK3 and CK4 are selected as the four first clock signal terminals, the clock signal terminal CK5 is selected as the forward scanning clock signal terminal, and the clock signal terminal CK8 is selected as the reverse scanning clock signal terminal. Referring to FIG. 5 and FIG. 6, the situation of forward scanning (the forward scanning control signal terminal CN is at a high level and the reverse scanning control signal terminal CNB is at a low level) is taken as an example to introduce the working principle of the shift register unit circuit shown in FIG. 4.

Referring to FIG. 4 and FIG. 5, before the first moment ta (may be referred to as a reset stage), the forward scanning input terminal GF, as the input terminal Gi, is always at a low level. The level at the second node PD is set as a high level in the time period in which the forward scanning clock signal terminal CK5 is at a high level every time, such that the second node PD maintains at a high level. The fifth transistor T5, all the sixth transistors T6 and all the seventh transistors T7 maintain being turned on. The levels at the first node PUCN, all the output terminals Go1, Go2, Go3 and Go4, and all the output control nodes PU1, PU2, PU3 and PU4 maintain at low levels. The whole shift register unit circuit works in a reset state.

Between the first moment ta and second moment tb (may be referred to as an input stage), the forward scanning input terminal GF, as the input terminal Gi, switches from a low level to a high level. The ninth transistor T9 is turned on. The first node PUCN is set to be at a high level. The level at the second node PD is set as a low level for the turn-on of the fourth transistor T4. All the output control nodes PU1, PU2, PU4 and PU4 are also set to be at high levels by the seventh transistor T7. All the eighth transistors T8 are turned on.

However, since the first clock signal terminals CK1, CK2, CK3 and CK4 are all at low levels, there is no signal output in this case, and the output terminals Go1, Go2, Go3 and Go4 still maintain at low levels.

Between the second moment tb and third moment tc (an example of the first time period, and the first time period may be referred to as an output stage), the forward scanning input terminal GF, as the input terminal Gi, switches from a high level to a low level, such that the ninth transistor T9 is turned off. The first node PUCN maintains at a high level under the action of the second capacitor C2. All the seventh transistors T7 and the eighth transistors T8 maintains being turned on. The second node PD maintains at the low level by the action of the fourth transistor T4. In this time period, whenever one first clock signal terminal switches from a low level to a high level, the eighth transistor T8 coupled thereto sets the potential at the coupled output terminal as a high level (its voltage serves as the gate-on voltage). Besides, under the self-boosting function, the coupled output control node rises to a voltage higher than the high-level voltage, such that the working point of the eighth transistor T8 approaches a saturation region, to complete pull-up of the level at the output terminal by heavy current. Thus, the output terminals Go1, Got, Go3 and Go4 sequentially output the gate-on voltage along with the first clock signal terminals CK1, CK2, CK3 and CK4.

Between the third moment tc and fourth moment td (may also be referred to as a reset stage), the level at the reverse input terminal GB, as the reset terminal Gs, switches to a high level, such that the first node PUCN is set at a low level under the action of the tenth transistor T10, and all the output control nodes are set at low levels under the action of the seventh transistor T7. Meanwhile, since the forward scanning clock signal terminal CK5 also switches to a high level, the level at the second node PD is set as a high level by the third transistor T3. Thus, the fifth transistor T5 and all the sixth transistors T6 are turned on. The levels at the first node PUCN and all the output terminals maintains at high levels, such that the shift register unit circuit returns to the reset state until the next first time to at which the forward input terminal GF switches to the high level arrives.

It can be seen that the shift register unit circuit provided in the embodiments of the present disclosure can implement output of four stages of signals by input of one stage of signals in coordination with the above circuit timing sequence, and can also implement output of any positive-integer stages of signals by input of one stage of signals through setting the amount and the timing sequence of the first clock signals. Compared with the case where input of one stage of signals is utilized to realize output of one stage of signals, the amount of the transistors required by the gate driver can be reduced, which contributes to compression of the space occupied by the gate driver and make the frame of the display product narrower.

It should be understood that the implementations shown in FIG. 4, FIG. 5 and FIG. 6 are merely exemplary and variations may be made thereto based on demands in specific application scenarios, without departing from the technical concept of the embodiments of the present disclosure. For example, the second capacitor C2 and/or the eleventh transistor T11 may be omitted. For another example, the first reset sub-circuit may be omitted also as shown in FIG. 3. For another example, the gate of the first transistor T1 may be coupled to the forward scanning clock signal terminal CK5, one of the source and the drain of the first transistor T1 may be coupled to the forward scanning control signal terminal CN and the other one is coupled to the third node P3. The gate of the second transistor T2 may be coupled to the reverse scanning clock signal terminal CK8, one of the source and the drain of the second transistor T2 may be coupled to the reverse scanning control signal terminal CNB and the other one is coupled to the third node P3. The enable control portion 142 can still set the level at the second node PD to be at an effective level when the coupled second clock signal terminal is at an effective level and the first node PUCN is at an ineffective level.

Figure 7:
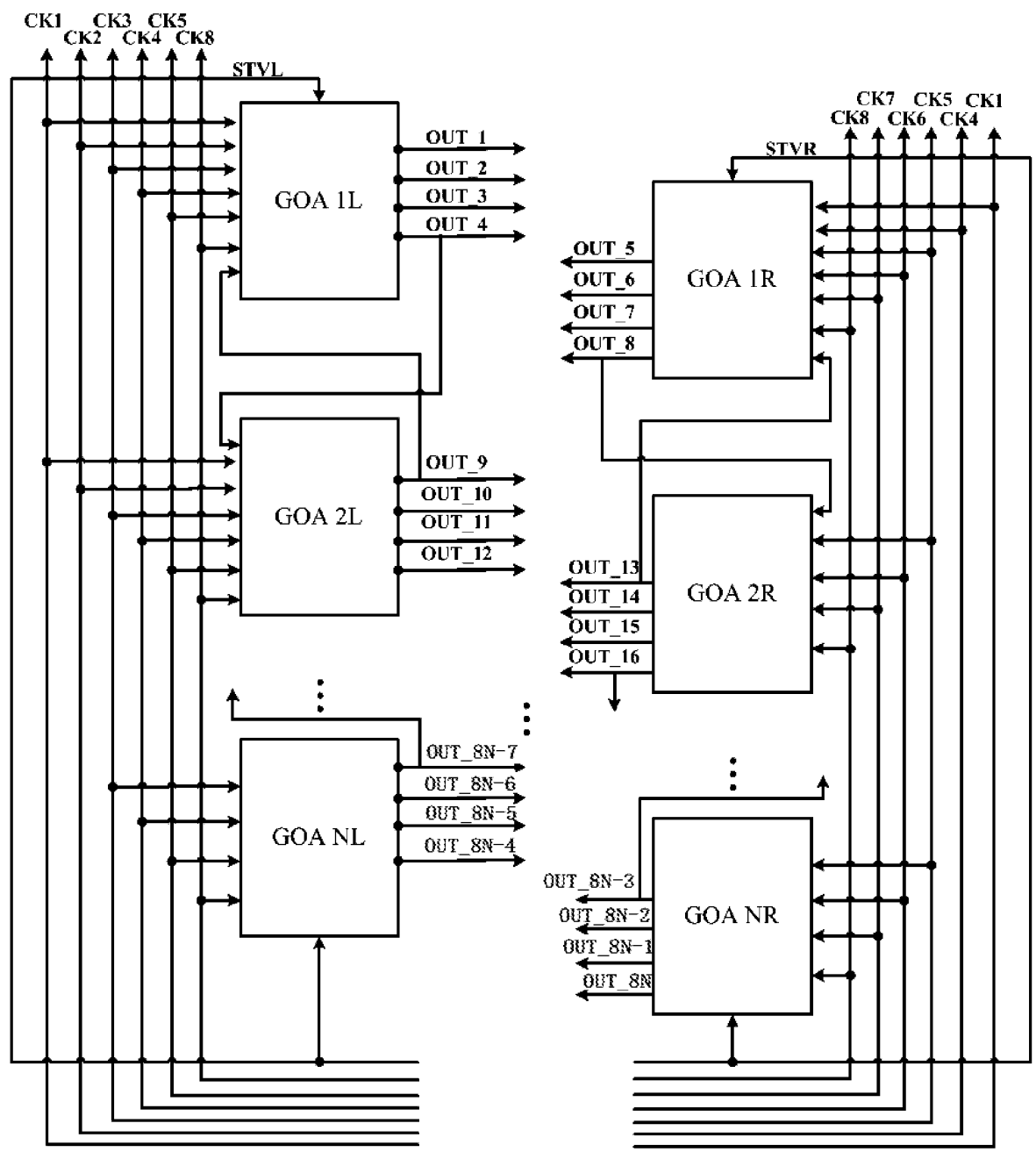
FIG. 7 is a structural block diagram of a scanning drive circuit provided in embodiments of the present disclosure.

It should be appreciated that a plurality of shift register unit circuits may be used to form a scanning drive circuit with output of specified stages of signals, and the gate driver may be implemented based on this. FIG. 7 is a block diagram of a structure of a scanning drive circuit provided in embodiments of the present disclosure. Referring to FIG. 7, the scanning drive circuit may include N odd-number stages of shift register unit circuits GOA 1L, GOA 2L . . . GOA NL and N even-number stages of shift register unit circuits GOA 1R, GOA 2R . . . GOA NR (N is a positive integer). Each shift register unit circuit may adopt the circuit structure shown in any one of FIG. 1 to FIG. 4.

Here, every two adjacent odd-number stages of shift register unit circuits are in a cascaded connection. Every two adjacent even-number stages of shift register unit circuits are also in a cascaded connection. Cascaded connection means that the last stage of output terminal of the previous stage of shift register unit circuit is coupled to the input terminal of the next stage of shift register unit circuit, and the frontmost stage of output terminal of the next stage of shift register unit circuit is coupled to the reset terminal of the previous stage of shift register unit circuit.

Exemplarily, referring to FIG. 7, the backmost stage of output terminal OUT_4 of the first stage of shift register unit circuit GOA 1L is coupled to the input terminal of the third stage of shift register unit circuit GOA 2L. The frontmost stage of output terminal OUT_9 of the third stage of shift register unit circuit GOA 2L is coupled to the reset terminal of the first stage of shift register unit circuit GOA 1L.

As the scanning drive circuit provided in the embodiments of the present disclosure has the bidirectional scanning function, the frontmost or the backmost stage of output in the N odd-number stages of shift register unit circuits may be triggered by a scanning initial signal terminal STVL, and the frontmost or the backmost stage of output in the N even-number stages of shift register unit circuits may be triggered by a scanning initial signal terminal STVR.

The first clock signals adopted by the N odd-number stages of shift register unit circuits may be the clock signal terminals CK1, CK2, CK3 and CK4 shown in FIG. 5, the adopted forward scanning clock signal terminal may be the clock signal terminal CK5 shown in FIG. 5, and the adopted reverse scanning clock signal terminal may be the clock signal terminal CK8 shown in FIG. 5. The first clock signal terminals adopted by the N even-number stages of shift register unit circuits may be the clock signal terminals CK5, CK6, CK7 and CK8 shown in FIG. 5, the adopted forward scanning clock signal terminal may be the clock signal terminal CK1 shown in FIG. 5, and the adopted reverse scanning clock signal terminal may be the clock signal terminal CK4 shown in FIG. 5.

In accordance with the working principle described above, each shift register unit circuit may provide output of four stages of signals, such that the N odd-number stages of shift register unit circuits provide output of the $1^{st}$, $2^{nd}$, $3^{rd}$, $4^{th}$, $10^{th}$, $11^{th}$, $12^{th}$ . . . $(8N-7)^{th}$, $(8N-6)^{th}$, $(8N-5)^{th}$ and $(8N-4)^{th}$ stages of signals: OUT_1, OUT_2, OUT_3, OUT_4, OUT_9, OUT_10, OUT_11, OUT_12 . . . OUT_8N-7, OUT_8N-6, OUT_8N-5 and OUT_8N-4. In addition, the N even-number stages of shift register unit circuits provide output of the $5^{th}$, $6^{th}$, $7^{th}$, $8^{th}$, $13^{th}$, $14^{th}$, $15^{th}$, $16^{th}$ . . . $(8N-3)^{th}$, $(8N-2)^{th}$, $(8N-1)^{th}$ and $8N^{th}$ stages of signals: OUT_5, OUT_6, OUT_7, OUT_8, OUT_13, OUT_14, OUT_15, OUT_16 . . . OUT_8N-3, OUT_8N-2, OUT_8N-1 and OUT_8N. It can be seen that the scanning drive circuit shown in FIG. 7 can output the gate-on voltages stage by stage at continuous 8N stages of scanning output terminals, to achieve an expected output function.

By taking this as an example, appropriate transformations may be made within a possible range based on the above example to obtain other types of scanning drive circuits. For example, output of 4N odd-number stages of signals may be provided through N odd-number stages of shift register unit circuits, and output of 4N even-number stages of signals may be provided through N even-number stages of shift register unit circuits. Here, the first clock signal terminals adopted by each odd-number stage of shift register unit circuit may be the clock signal terminals CK1, CK3, CK5 and CK7 shown in FIG. 5, the adopted forward scanning clock signal terminal may be the clock signal terminal CK8 shown in FIG. 5, and the adopted reverse scanning clock signal terminal may be the clock signal terminal CK8 shown in FIG. 5. The first clock signal terminals adopted by each even-number of shift register unit circuit may be the clock signal terminals CK2, CK4, CK6 and CK8 shown in FIG. 5, the adopted forward scanning clock signal terminal may be the clock signal terminal CK1 shown in FIG. 5, and the adopted reverse scanning clock signal terminal may be the clock signal terminal CK1 shown in FIG. 5). The scanning drive circuit obtained in this way can also implement output of the gate-on voltage stage by stage by continuous 8N stages of scanning output terminals, to achieve an expected output function.

Based on the same inventive concept, the embodiments of the present disclosure provide a display panel, including the scanning drive circuit provided in the above embodiments. In the plurality of shift register unit circuits included in the scanning drive circuit, odd-number stages of the shift register unit circuits and even-number stages of the shift register unit circuits are at two side of the display panel, respectively.

Based on the same inventive concept, the embodiments of the present disclosure provide a display device including the display panel described above. The display device in the embodiment of the present disclosure may be any product or part with a display function, such as, a mobile phone, a tablet PC, a television, a display, a laptop computer, a digital photo frame or a navigator. Based on the beneficial effects that can be achieved by the scanning drive circuit, the display device can also achieve the same or corresponding beneficial effects.

The foregoing descriptions are merely exemplary embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A scanning drive circuit, comprising at least one shift register unit circuit, wherein the shift register unit circuit comprises:
   an input sub-circuit coupled to a first node and an input terminal of the shift register unit circuit respectively and configured to set a level at the first node to be an effective level when the input terminal is at an effective level;

at least two transmission sub-circuits, each of which is coupled to the first node and one output control node and configured to set a level at the coupled output control node to be an effective level when the first node is at an effective level;

at least two output sub-circuits, each of which is coupled to one output control node, one first clock signal terminal and one output terminal of the shift register unit circuit respectively and configured to conduct the coupled first clock signal terminal to the coupled output terminal when the coupled output control node is at an effective level;

a reset control sub-circuit, coupled to the first node and a second node respectively, and configured to set a level at the second node to be an ineffective level when the first node is at an effective level and set a level at the second node to be an effective level when the first node is at an ineffective level;

at least two first reset sub-circuits, each of which is coupled to the second node and one of the output terminals, and each of the first reset sub-circuits is configured to set a level at the coupled output terminal to be an ineffective level when the second node is at an effective level; and a second reset sub-circuit coupled to the second node and configured to set the level at each of the output control nodes to be an ineffective level when the second node is at an effective level.

2. The scanning drive circuit according to claim 1, comprising: a plurality of odd-number stages of the shift register unit circuits and a plurality of even-number stages of the shift register unit circuits;

wherein every two adjacent odd-number stages of the shift register unit circuits are in a cascaded connection with each other, and every two adjacent even-number stages of the shift register unit circuits are in a cascaded connection with each other.

3. A display panel, comprising a scanning drive circuit, wherein the scanning drive circuit comprises a plurality of shift register unit circuits and each of the shift register unit circuits comprises:

an input sub-circuit coupled to a first node and an input terminal of the shift register unit circuit respectively and configured to set a level at the first node to be an effective level when the input terminal is at an effective level;

at least two transmission sub-circuits, each of which is coupled to the first node and one output control node and configured to set a level at the coupled output control node to be an effective level when the first node is at an effective level;

at least two output sub-circuits, each of which is coupled to one output control node, one first clock signal terminal and one output terminal of the shift register unit circuit respectively and configured to conduct the coupled first clock signal terminal to the coupled output terminal when the coupled output control node is at an effective level;

a reset control sub-circuit, coupled to the first node and a second node respectively, and configured to set a level at the second node to be an ineffective level when the first node is at an effective level and set a level at the second node to be an effective level when the first node is at an ineffective level;

at least two first reset sub-circuits, each of which is coupled to the second node and one of the output terminals, and each of the first reset sub-circuits is configured to set a level at the coupled output terminal to be an ineffective level when the second node is at an effective level; and a second reset sub-circuit coupled to the second node and configured to set the level at each of the output control nodes to be an ineffective level when the second node is at an effective level;

wherein in the plurality of shift register unit circuits, odd-number stages of the shift register unit circuits and even-number stages of the shift register unit circuits are at two side of the display panel, respectively.

4. A shift register unit circuit, comprising:

an input sub-circuit coupled to a first node and an input terminal of the shift register unit circuit and configured to set a level at the first node to be an effective level when the input terminal is at an effective level;

at least two transmission sub-circuits, each of which is coupled to the first node and one output control node and configured to set a level at the coupled output control node to be an effective level when the first node is at an effective level;

at least two output sub-circuits, each of which is coupled to one output control node, one first clock signal terminal and one output terminal of the shift register unit circuit and configured to conduct the coupled first clock signal terminal to the coupled output terminal when the coupled output control node is at an effective level;

a reset control sub-circuit, coupled to the first node and a second node respectively, and configured to set a level at the second node to be an ineffective level when the first node is at an effective level and set a level at the second node to be an effective level when the first node is at an ineffective level;

at least two first reset sub-circuits, each of which is coupled to the second node and one of the output terminals, and each of the first reset sub-circuits is configured to set a level at the coupled output terminal to be an ineffective level when the second node is at an effective level; and a second reset sub-circuit coupled to the second node and configured to set the level at each of the output control nodes to be an ineffective level when the second node is at an effective level.

5. The shift register unit circuit according to claim 4, wherein the at least two transmission sub-circuits comprise four of the transmission sub-circuits, and the at least two output sub-circuits comprise four of the output sub-circuits.

6. The shift register unit circuit according to claim 4, wherein the reset control sub-circuit comprises:

a reset control portion coupled to the first node and the second node respectively and configured to set the level at the second node to be an ineffective level when the first node is at an effective level; and an enable control portion coupled to the second node and a second clock signal terminal respectively and configured to set the level at the second node to be an effective level when the coupled second clock signal terminal is at an effective level and the first node is at an ineffective level.

7. The shift register unit circuit according to claim 6, wherein the second clock signal terminal comprises a forward scanning clock signal terminal and a reverse scanning clock signal terminal; and the enable control portion comprises a first transistor, a second transistor and a third transistor;
  wherein a gate of the first transistor is coupled to a forward scanning control signal terminal, one of a source and a drain of the first transistor is coupled to the forward scanning clock signal terminal, and the other one of the first transistor is coupled to a third node;
  a gate of the second transistor is coupled to a reverse scanning control signal terminal, one of a source and a drain of the second transistor is coupled to the reverse scanning clock signal terminal, and the other one of the second transistor is coupled to the third node; and
  a gate of the third transistor is coupled to the third node, one of a source and a drain of the third transistor is coupled to a first power source terminal and the other one of the third transistor is coupled to the first node.

8. The shift register unit circuit according to claim 7, wherein the enable control portion further comprises a first capacitor, wherein one terminal of the first capacitor is coupled to the second node and the other terminal of the first capacitor is coupled to a second power source terminal.

9. The shift register unit circuit according to claim 8, comprising:
  four of the transmission sub-circuits, four of the output sub-circuits in a one-to-one correspondence with the four of the transmission sub-circuits, and four of the output terminals in a one-to-one correspondence with the four of the output sub-circuits; the input sub-circuit is further coupled to a reset terminal of the shift register unit circuit, and the input terminal and the reset terminal are one of a forward input terminal and a reverse input terminal of the shift register unit circuit respectively;
  the reset control portion comprises a fourth transistor; the second reset sub-circuit comprises a fifth transistor; each of the first reset sub-circuits comprises a sixth transistor; the transmission sub-circuit comprises a seventh transistor; the output sub-circuit comprises an eighth transistor; the input sub-circuit comprises a ninth transistor and a tenth transistor; and the shift register unit circuit further comprises an eleventh transistor and a second capacitor;
  wherein a gate of the fourth transistor is coupled to the first node, one of a source and a drain of the fourth transistor is coupled to the second node, and the other one of the fourth transistor is coupled to a second power source terminal;
  a gate of the fifth transistor is coupled to the second node, one of a source and a drain of the fifth transistor is coupled to the first node, and the other one of the fifth transistor is coupled to a third power source terminal;
  a gate of the sixth transistor is coupled to the second node, one of a source and a drain of the sixth transistor is coupled to the corresponding output terminal, and the other one of the sixth transistor is coupled to a fourth power source terminal;
  a gate of the seventh transistor is coupled to a fifth power source terminal, a source of the seventh transistor is coupled to the first node, and a drain of the seventh transistor is coupled to the corresponding output control node;
  a gate of the eighth transistor is coupled to the output control node, one of a source and a drain of the eighth transistor is coupled to the corresponding first clock signal terminal, and the other one of the eighth transistor is coupled to the corresponding output terminal;
  a gate of the ninth transistor is coupled to the forward input terminal, one of a source and a drain of the ninth transistor is coupled to a forward scanning control signal terminal, and the other one of the ninth transistor is coupled to the first node;
  a gate of the tenth transistor is coupled to the reverse input terminal, one of a source and a drain of the tenth transistor is coupled to a reverse scanning control signal terminal, and the other one of the tenth transistor is coupled to the first node;
  a gate of the eleventh transistor is coupled to a control signal terminal, one of a source and a drain of the eleventh transistor is coupled to the second node, and the other one of the eleventh transistor is coupled to the second power source terminal; and
  one terminal of the second capacitor is coupled to the first node, and the other terminal of the second capacitor is coupled to a third power source terminal.

10. The shift register unit circuit according to claim 6, wherein the reset control portion comprises a fourth transistor,
  wherein a gate of the fourth transistor is coupled to the first node; one of a source and a drain of the fourth transistor is coupled to the second node, and the other one of the fourth transistor is coupled to a second power source terminal.

11. The shift register unit circuit according to claim 4, wherein the second reset sub-circuit comprises a fifth transistor,
  wherein a gate of the fifth transistor is coupled to the second node; one of a source and a drain of the fifth transistor is coupled to the first node, and the other one of the fifth transistor is coupled to a third power source terminal.

12. The shift register unit circuit according to claim 4, wherein each of the first reset sub-circuits comprises a sixth transistor,
  wherein a gate of the sixth transistor is coupled to the second node; one of a source and a drain of the sixth transistor is coupled to the corresponding output terminal, and the other one of the sixth transistor is coupled to a fourth power source terminal.

13. The shift register unit circuit according to claim 4, wherein the transmission sub-circuit comprises a seventh transistor;
  wherein a gate of the seventh transistor is coupled to a fifth power source terminal, a source of the seventh transistor is coupled to the first node, and a drain of the seventh transistor is coupled to the corresponding output control node.

14. The shift register unit circuit according to claim 4, wherein the output sub-circuit comprises an eighth transistor;
  wherein a gate of the eighth transistor is coupled to the corresponding output control node, one of a source and a drain of the eighth transistor is coupled to the corresponding first clock signal terminal and the other one of the eighth transistor is coupled to the corresponding output terminal.

15. The shift register unit circuit according to claim 4, wherein the input sub-circuit is further coupled to a reset terminal of the shift register unit circuit and further configured to set the level at the first node to be an ineffective level when the reset terminal is at an effective level; the input terminal and the reset terminal are one of a forward input terminal and a reverse input terminal of the shift register unit circuit respectively.

16. The shift register unit circuit according to claim 15, wherein the input sub-circuit comprises a ninth transistor and a tenth transistor;
- wherein a gate of the ninth transistor is coupled to the forward input terminal, one of a source and a drain of the ninth transistor is coupled to a forward scanning control signal terminal, and the other one of the ninth transistor is coupled to the first node; and
- a gate of the tenth transistor is coupled to the reverse input terminal, one of a source and a drain of the tenth transistor is coupled to a reverse scanning control signal terminal and the other one of the tenth transistor is coupled to the first node.

17. The shift register unit circuit according to claim 4, further comprising: an eleventh transistor,
- wherein a gate of the eleventh transistor is coupled to a control signal terminal, one of a source and a drain of the eleventh transistor is coupled to the second node and the other one of the eleventh transistor is coupled to a second power source terminal.

18. The shift register unit circuit according to claim 4, further comprising:
- a second capacitor, wherein one terminal of the second capacitor is coupled to the first node and the other terminal of the second capacitor is coupled to a third power source terminal.

19. A method for driving the shift register unit circuit according to claim 4, comprising:
- setting a level at the input terminal to be at an effective level before a first time period;
- wherein the first time period is a time period in each clock cycle of the first clock signal terminal, a time period in which a first clock signal terminal coupled to any of the output sub-circuits is at an effective level is within the first time period.

* * * * *